(12) United States Patent
Tsai et al.

(10) Patent No.: US 7,759,977 B1
(45) Date of Patent: Jul. 20, 2010

(54) BUFFERING CIRCUIT

(75) Inventors: Hung-Chieh Tsai, Tainan County (TW); Yu-Hsin Lin, Taipei (TW); Jong-Woei Chen, Taichung County (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 12/480,669

(22) Filed: Jun. 8, 2009

(51) Int. Cl.
*H03K 19/094* (2006.01)
(52) U.S. Cl. .......................... 326/83; 326/68; 327/112; 327/333
(58) Field of Classification Search .................. 326/23, 326/27, 63, 68, 83; 327/112, 333
See application file for complete search history.

(56) References Cited

U.S. PATENT DOCUMENTS 5,568,081 A * 10/1996 Lui et al. ..................... 327/380
5,670,905 A * 9/1997 Keeth et al. .................. 327/333

OTHER PUBLICATIONS

Bjornar Hernes et al., A 92.5mW 205MS/s 10b Pipeline IF ADC Implemented in 1.2V/3.3V 0.13um CMOS, ISSCC 2007/SESSION 25/NYQUIST ADC TECHNIQUES/ 25.6, Feb. 14, 2007.

* cited by examiner

*Primary Examiner*—Daniel D Chang
(74) *Attorney, Agent, or Firm*—Winston Hsu

(57) ABSTRACT

A buffering circuit includes: a first transistor having a gate terminal coupled to an input signal for buffering the input signal to generate an output signal under an operating current, a second transistor cascoded with the first transistor for generating the operating current for the first transistor according to a control signal at a gate terminal of the second transistor, and a control circuit having a first terminal coupled to the gate terminal of the first transistor and a second terminal coupled to a reference source. The control circuit adjusts the control signal according to the input signal and the reference source, wherein when a voltage level of the input signal varies, the control circuit is arranged to adjust a voltage level of the control signal such that the adjusted voltage level of the control signal varies inversely proportional to the varied voltage level of the input signal.

20 Claims, 6 Drawing Sheets

BUFFERING CIRCUIT

BACKGROUND

The present invention relates to a buffering circuit, and more particularly to a high linearity buffering circuit.

A buffer is an important circuit in the analog circuit field. Normally, a buffer is utilized for converting an input signal into an output signal having a driving capability different from the input signal one while maintaining the characteristic carried by the input signal.

The buffer plays a critical role in a wireless communication system. In the wireless communication system, a receiver is utilized for receiving an RF (radio frequency) signal with a frequency band ranged around a few hundred mega hertz (MHz) or around a few giga hertz (GHz). FIG. 1 is a diagram illustrating a conventional receiver 10 of the wireless communication system. The receiver 10 comprises an antenna 11, a low-noise amplifier (LNA) 12, a local oscillator 13, a mixer 14, a programming gain amplifier (PGA) 15, a filter 16, a buffer 17, and an analog-to-digital converter (ADC) 18. A transmitted signal Str is first received by the antenna 11. The antenna 11 then converts the transmitted signal Str in the form of electromagnetic waves into a received signal Sr in the form of electrical signal. Meanwhile, the low-noise amplifier 12 is utilized to amplify the received signal Sr for suppressing the noise component of the received signal Sr in order to generate a low noise signal Ss. The low noise signal Ss has an appropriate signal to noise ratio (SNR) for a specified modulation and is fed to the mixer 14 for frequency down-conversion by the local oscillator 13 to generate a down converted signal Sd. The programming gain amplifier 15 and the filter 16 selectively filter and amplify the down converted signal Sd to further enhance the SNR performance and perform a good adjacent channel or blocker suppression upon the down converted signal Sd. Normally, the analog-to-digital converter 18 performs with a high dynamic range (DR) and good SNR in the wireless communication system, and thus the gain of the programming gain amplifier 15 and the cost of the filter 16 can be reduced. However, the buffer 17 with high linearity must be coupled between the filter 16 and the analog-to-digital converter 18 to provide enough driving capability for the analog signal Sa to be fed to the analog-to-digital converter 18. Therefore, providing a buffer with good linearity and large driving capability is a significant concern in the analog circuit field.

SUMMARY OF THE INVENTION

One of the objectives of the present invention is to provide a high linearity buffering circuit to solve the above-mentioned problem.

According to an embodiment of the present invention, a buffering circuit is disclosed. The buffering circuit comprises a first field effect transistor, a second field effect transistor, and a control circuit. The first field effect transistor comprises a gate terminal coupled to an input signal for buffering the input signal to generate an output signal under an operating current. The second field effect transistor is cascoded with the first field effect transistor for generating the operating current for the first field effect transistor according to a control signal at a gate terminal of the second field effect transistor. The control circuit comprises a first terminal coupled to the gate terminal of the first field effect transistor and a second terminal coupled to a reference source. The control circuit adjusts the control signal according to the input signal and the reference source, wherein when a voltage level of the input signal varies, the control circuit is arranged to adjust a voltage level of the control signal such that the adjusted voltage level of the control signal varies inversely proportional to the varied voltage level of the input signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
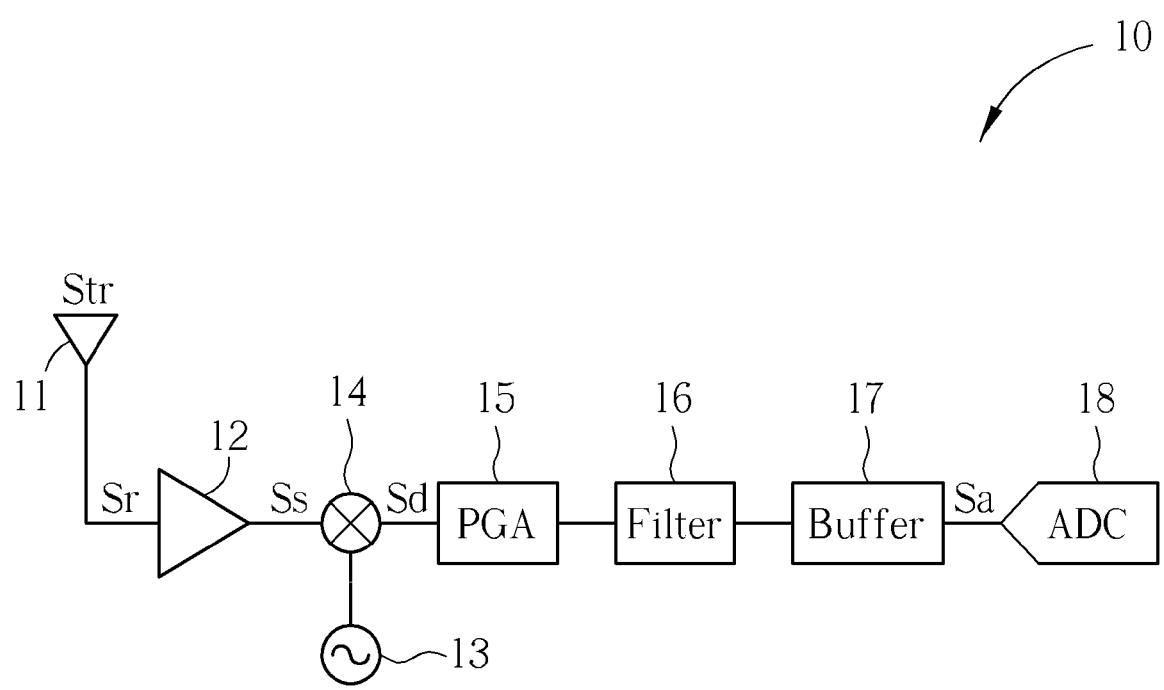
FIG. 1 is a diagram illustrating a conventional receiver of a wireless communication system.
Figure 2:
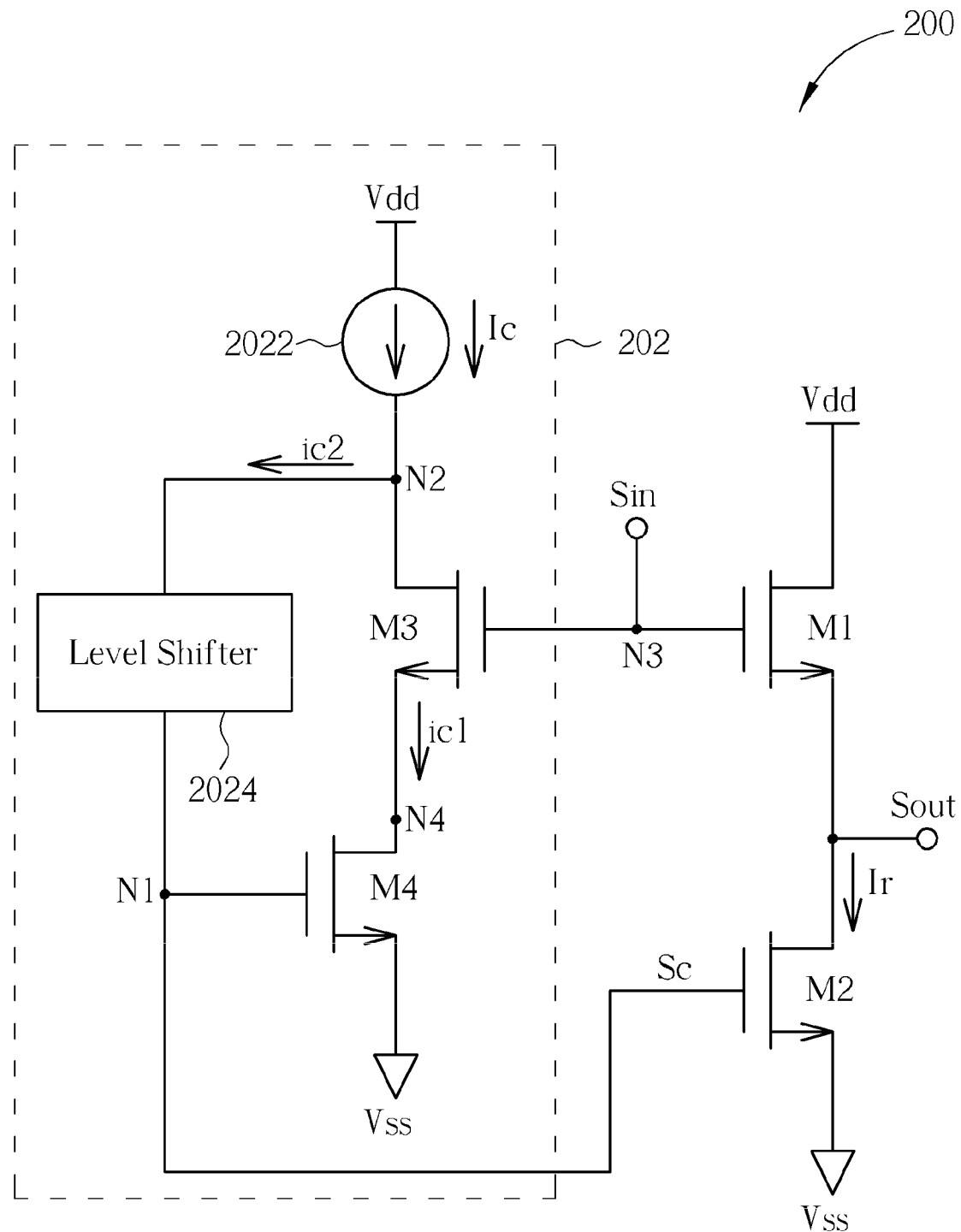
FIG. 2 is a diagram illustrating a buffering circuit according to a first embodiment of the present invention.

FIG. 2 is a diagram illustrating a buffering circuit 200 according to a first embodiment of the present invention. The buffering circuit 200 operates between a first supply voltage Vdd and a second supply voltage Vss, and comprises a first N-type metal oxide semiconductor field effect transistor (N-type MOSFET) M1, a second N-type MOSFET M2, and a control circuit 202. The first N-type MOSFET M1 comprises a gate terminal N3 coupled to an input signal Sin for buffering the input signal Sin to generate an output signal Sout under an operating current Ir. The second N-type MOSFET M2 is cascoded with the first N-type MOSFET M1 for generating the operating current Ir for the first N-type MOSFET M1 according to a control signal Sc at a gate terminal N1 of the second N-type MOSFET M2. The control circuit 202 comprises a first terminal coupled to the gate terminal N3 of the first N-type MOSFET M1 and a second terminal N2 coupled to a reference source 2022. Please note that, in this embodiment, the reference source 2022 is a constant current source providing a constant current Ic for the control circuit 202. However, this exemplary implementation is not meant to be a limitation of the present invention. The reference source 2022 may be a constant voltage source providing a constant voltage for the control circuit 202 in another embodiment of the present invention. The control circuit 202 adjusts the control signal Sc according to the input signal Sin and the constant current Ic, wherein when a voltage level of the input signal Sin varies, the control circuit 202 is arranged to adjust a voltage level of the control signal Sc such that the adjusted voltage level of the control signal Sc varies inversely proportional to the varied voltage level of the input signal Sin. More specifically, since the control signal Sc is coupled to the gate terminal of the second N-type MOSFET M2, the control circuit 202 adjusts the control signal Sc to increase the voltage level of the control signal Sc so as to increase the operating current Ir when the voltage level of the input signal Sin decreases, and vice versa.

The control circuit 202 comprises at least the reference source 2022, a third N-type MOSFET M3, and a fourth N-type MOSFET M4. The third N-type MOSFET M3 comprises a gate terminal N3 coupled to the gate terminal of the first N-type MOSFET M1, and a drain terminal coupled to the second terminal N2. The fourth N-type MOSFET M4 comprises a drain terminal N4 coupled to a source terminal of the third N-type MOSFET M3, a source terminal coupled to the second supply voltage Vss, and a gate terminal coupled to the reference source 2022 and the gate terminal N1 of the second N-type MOSFET M2. Please note that, in order to enlarge the operating range of the third N-type MOSFET M3 for preventing the third N-type MOSFET M3 from entering the linear region, a level shifter 2024 is coupled between the drain terminal of the third N-type MOSFET M3, i.e., N2, and the gate terminal of the fourth N-type MOSFET M4, i.e., N1. In other words, the level shifter 2024 adjusts the voltage drop between the drain terminal of the third N-type MOSFET M3 and the gate terminal of the fourth N-type MOSFET M4. In addition, the level shifter 2024 comprises a resistive device in this embodiment.

According to the first embodiment of the present invention, when the input signal Sin having a swing (particularly a large swing) is applied to the gate terminal N3 of the first N-type MOSFET M1, the operating current Ir generated by the second N-type MOSFET M2 can be substantially maintained at a constant level such that the effect of finite and nonlinear output impedance of the first N-type MOSFET M1 can be eliminated. The following description discloses the operation of the buffering circuit 200 of the present invention.

When the voltage of the input signal Sin decrease, the voltage at the drain terminal N4 is also decrease, and thus the current ic1 flowing through the fourth N-type MOSFET M4 decrease. Then, the voltage at the gate terminal N1 is increased to increase the current ic1. When the gate terminal N1 increase, the second terminal N2 increase accordingly to form a feedback mechanism for keeping the current ic1 substantially intact. Meanwhile, the voltage of the control signal Sc is increased since the gate terminal N1 is coupled to the gate terminal of the second N-type MOSFET M2. Accordingly, the increased control signal Sc increases the operating current Ir of the second N-type MOSFET M2 to keep the operating current Ir substantially intact. Please note that, the level shifter 2024 coupled between the gate terminal N1 and the second terminal N2 is utilized to generate a shifting voltage between the gate terminal N1 and the second terminal N2 for enlarging the operating range of the third N-type MOSFET M3.

Briefly, the operating current Ir of the buffering circuit 200 can be operated at a nearly constant level under the full swing condition of the input signal Sin and the output signal Sout. Therefore, the control circuit 202 increases the linearity of the buffering circuit 200.

Figure 3:
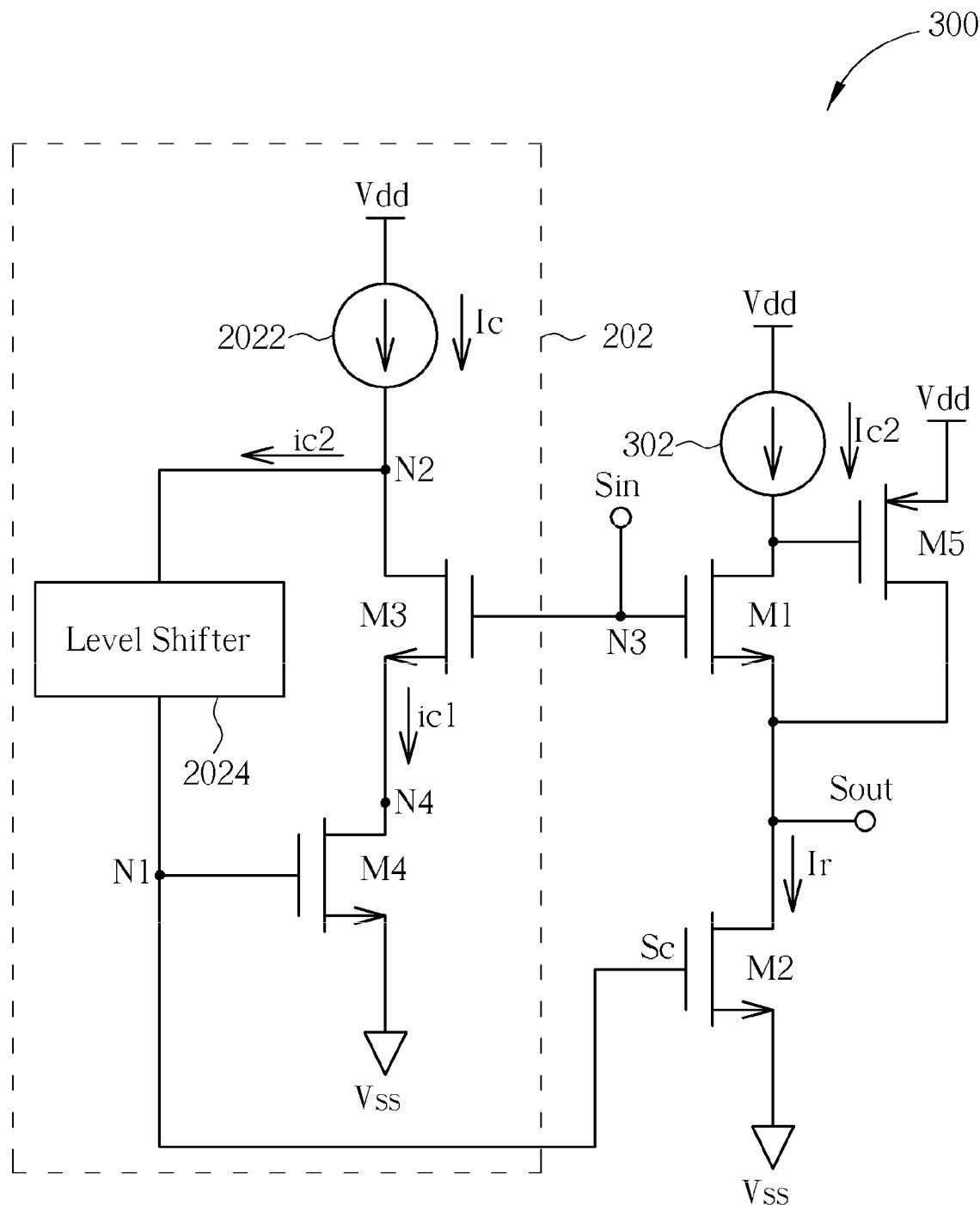
FIG. 3 is a diagram illustrating a buffering circuit according to a second embodiment of the present invention.

It should be noted that the buffering circuit 200 may not be good enough for the case that requires larger output swing. Therefore, to further guarantee that the second N-type MOSFET M2 generates the constant operating current Ir, a P-type MOSFET M5 is coupled to the output terminal, i.e., the source terminal of the first N-type MOSFET M1, of the buffering circuit 200 as shown in FIG. 3. FIG. 3 is a diagram illustrating a buffering circuit 300 according to a second embodiment of the present invention. Compared to the buffering circuit 200 of FIG. 2, the buffering circuit 300 further comprises the P-type MOSFET M5 and a current source 302, in which the gate terminal of the P-type MOSFET M5 is coupled to the drain terminal of the first N-type MOSFET M1, the source terminal of the P-type MOSFET M5 is coupled to the first supply voltage Vdd, and the drain terminal of the P-type MOSFET M5 is coupled to the source terminal of the first N-type MOSFET M1. In addition, the current source 302 generates a constant current Ic2 for the first N-type MOSFET M1. According to the buffering circuit 300, the P-type MOSFET M5 provides an additional transconductance (gm) for the operating current Ir. In other words, the P-type MOSFET M5 further reduces the distortion of the first N-type MOSFET M1 by keeping the operating current Ir intact. Since the buffering circuit 300 is similar to the buffering circuit 200 except for the P-type MOSFET M5 and the current source 302, a person with ordinary skill in the art should readily understand the technical characteristic of the buffering circuit 300 after reading the disclosure of the buffering circuit 200, and therefore a detailed description is omitted here for brevity.

It should be noted that the differential versions of the buffering circuit 200 as well as the buffering circuit 300 also belong to the scope of the present invention. In the differential version of the buffering circuit 200, two control circuits 202 are adopted to track fully differential input signals inputted to the differential version of the buffering circuit 200. In addition, the differential version of the buffering circuit 200 performs with good total harmonic distortion (THD), especially in large signal swing.

Figure 4:
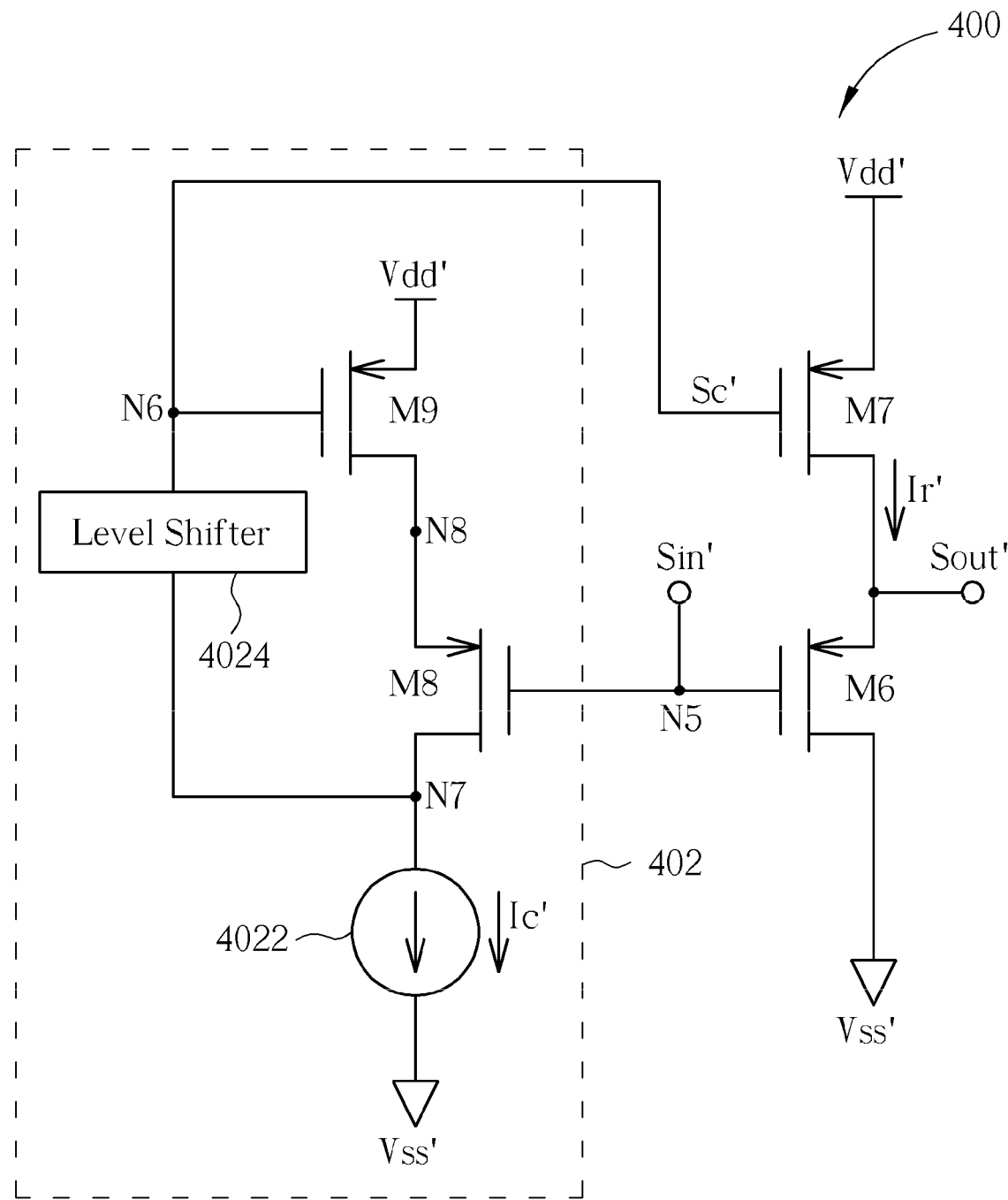
FIG. 4 is a diagram illustrating a buffering circuit according to a third embodiment of the present invention.

Please refer to FIG. 4. FIG. 4 is a diagram illustrating a buffering circuit 400 according to a third embodiment of the present invention. The buffering circuit 400 is the P-type MOSFET version of the buffering circuit 200. The buffering circuit 400 operates between a first supply voltage Vdd' and a second supply voltage Vss', and comprises a first P-type metal oxide semiconductor field effect transistor (P-type MOSFET) M6, a second P-type MOSFET M7, and a control circuit 402. The first P-type MOSFET M6 comprises a gate terminal N5 coupled to an input signal Sin' for buffering the input signal Sin' to generate an output signal Sout' under an operating current Ir'. The second P-type MOSFET M7 is cascoded with the first P-type MOSFET M6 for generating the operating current Ir' for the first P-type MOSFET M6 according to a control signal Sc' at a gate terminal N6 of the second P-type MOSFET M7. The control circuit 402 comprises a first terminal coupled to the gate terminal N5 of the first P-type MOSFET M6 and a second terminal N7 coupled to a reference source 4022. Please note that, in this embodiment, the reference source 4022 is a constant current source providing a constant current Ic' for the control circuit 402. However, this exemplary implementation is not meant to be a limitation of the present invention. The reference source 4022 may be a constant voltage source providing a constant voltage for the control circuit 402 in another embodiment of the present invention. The control circuit 402 adjusts the control signal Sc' according to the input signal Sin' and the constant current Ic', wherein when a voltage level of the input signal Sin' varies, the control circuit 402 is arranged to adjust a voltage level of the control signal Sc' such that the adjusted voltage level of the control signal Sc' varies inversely proportional to the varied voltage level of the input signal. More specifically, since the control signal Sc' is coupled to the gate terminal of the second P-type MOSFET M7, the control circuit 402 adjusts the control signal Sc' to decrease the voltage level of the control signal Sc' to increase the operating current Ir' when the voltage level of the input signal Sin' increases, and vice versa.

Similarly, the control circuit 402 comprises at least the reference source 4022, a third P-type MOSFET M8, and a fourth P-type MOSFET M9. The third P-type MOSFET M8 comprises a gate terminal coupled to the gate terminal N5 of the first P-type MOSFET M6, and a drain terminal coupled to the second terminal N7. The fourth P-type MOSFET M9 comprises a drain terminal N8 coupled to a source terminal of the third P-type MOSFET M8, a source terminal coupled to the first supply voltage Vdd', and a gate terminal coupled to the reference source 4022 and the gate terminal N6 of the second P-type MOSFET M7. Please note that, to enlarge the operating range of the third P-type MOSFET M8 for preventing the third P-type MOSFET M8 from entering the linear region, a level shifter 4024 is coupled between the drain terminal of the third P-type MOSFET M8, i.e., N7, and the gate terminal of the fourth P-type MOSFET M9, i.e., N6. In other words, the level shifter 4024 adjusts the voltage drop between the drain terminal of the third P-type MOSFET M8 and the gate terminal of the fourth P-type MOSFET M9. In addition, the level shifter 4024 comprises a resistive device in this embodiment. It should be noted that a person with ordinary skill in the art should readily understand the technical characteristic of the buffering circuit 400 after reading the disclosure upon the buffering circuit 400, and therefore a detailed description is omitted here for brevity. Furthermore, the differential version of the buffering circuit 400 also belongs to the scope of the present invention. In the differential version of the buffering circuit 400, two control circuits 402 are adopted to track fully differential input signals inputted to the differential version of the buffering circuit 400. In addition, the differential version of the buffering circuit 400 also performs with good total harmonic distortion (THD), especially in large signal swing.

Figure 5:
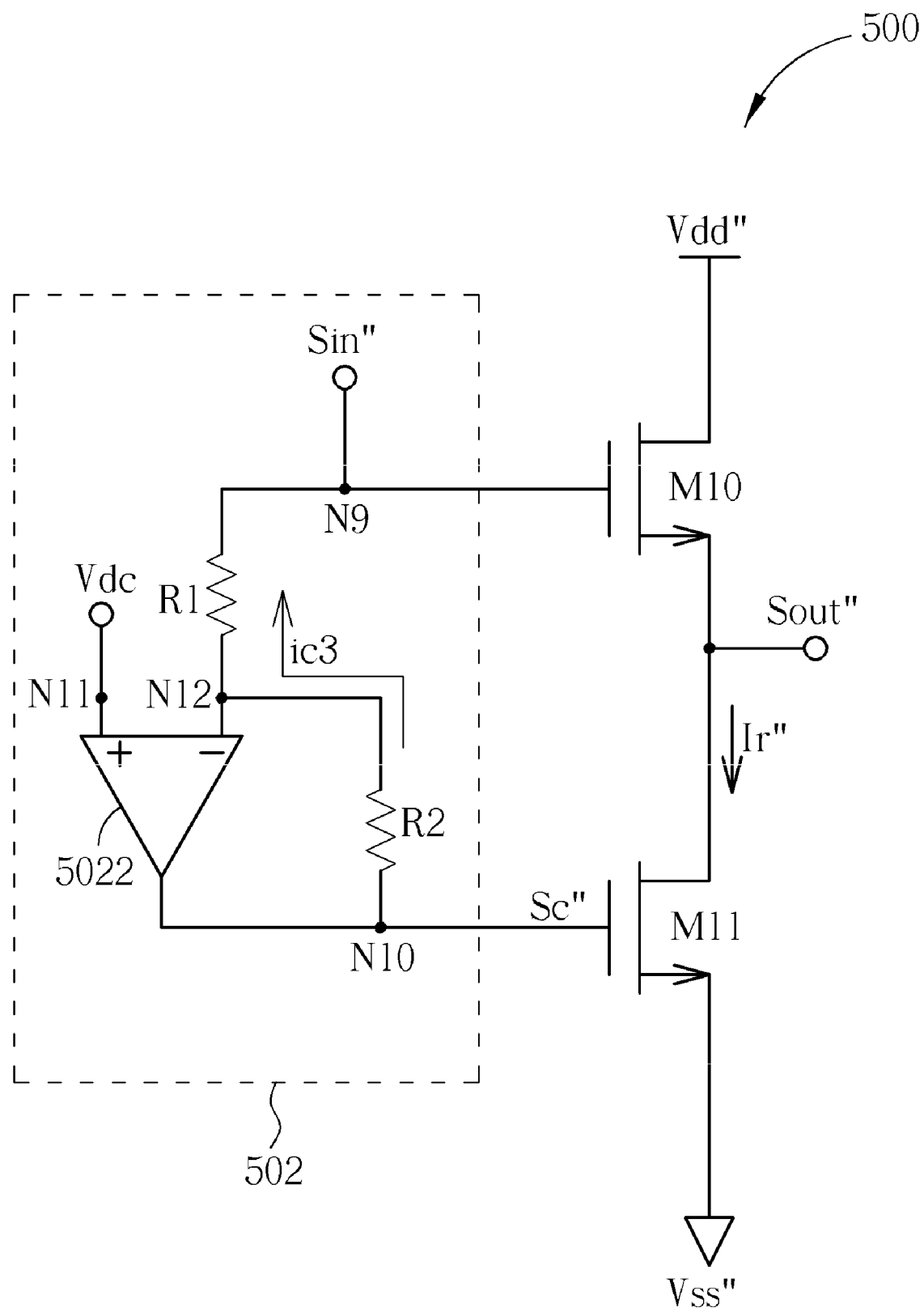
FIG. 5 is a diagram illustrating a buffering circuit according to a fourth embodiment of the present invention.

FIG. 5 is a diagram illustrating a buffering circuit 500 according to a fourth embodiment of the present invention. The buffering circuit 500 operates between a first supply voltage Vdd" and a second supply voltage Vss", and comprises a first N-type metal oxide semiconductor field effect transistor (N-type MOSFET) M10, a second N-type MOSFET M11, and a control circuit 502. The first N-type MOSFET M10 comprises a gate terminal N9 coupled to an input signal Sin" for buffering the input signal Sin" to generate an output signal Sout" under an operating current Ir". The second N-type MOSFET M11 is cascoded with the first N-type MOSFET M10 for generating the operating current Ir" for the first N-type MOSFET M10 according to a control signal Sc" at a gate terminal N10 of the second N-type MOSFET M11. The control circuit 502 comprises a first terminal coupled to the gate terminal N9 of the first N-type MOSFET M10, a second terminal N11 coupled to a reference voltage Vdc, and a third terminal coupled to the gate terminal N10 of the second N-type MOSFET M11. The control circuit 502 adjusts the control signal Sc" according to the input signal Sin" and the reference voltage Vdc, wherein when a voltage level of the input signal Sin" decreases, the control circuit 502 is arranged to increase a voltage level of the control signal Sc".

The control circuit 502 comprises a first resistive device R1, a second resistive device R2, and an operational amplifier 5022. The first resistive device R1 has a first terminal coupled to the gate terminal N9 of the first N-type MOSFET M10. The operational amplifier 5022 has a first input terminal (+) coupled to the reference voltage Vdc, a second input terminal (−) coupled to a second terminal N12 of the first resistive device R1, and an output terminal coupled to the gate terminal N10 of the second N-type MOSFET M11. The second resistive device R2 is coupled between the second input terminal (−) of the operational amplifier 5022 and the gate terminal N10 of the second N-type MOSFET M11.

Similar to the buffering circuit 200, when the input signal Sin" having a swing (particularly a large swing) is applied to the gate terminal N9 of the first N-type MOSFET M10, the operating current Ir" generated by the second N-type MOSFET M11 can be maintained at a substantially constant level such that the effect of finite and nonlinear output impedance of the first N-type MOSFET M10 can be eliminated.

According to the buffering circuit 500 as shown in FIG. 5, the feedback mechanism comprised of the first resistive device R1, the second resistive device R2, and the operational amplifier 5022 keeps the voltage at the second terminal N12 of the first resistive device R1 intact, which is substantially equal to the reference voltage Vdc. When the swing of the input signal Sin" decreases, an AC current ic3 is induced to flow through the first resistive device R1 and the second resistive device R2. Therefore, the voltage level at the gate terminal N10 of the second N-type MOSFET M11 is increased due to the AC current ic3 flowing through the second resistive device R2. Similar to the above-mentioned buffering circuit 200, the increasing of the voltage level at the gate terminal N10 keeps the operating current Ir" intact. When the swing of the input signal Sin" increases, the voltage level at the gate terminal N10 of the second N-type MOSFET M11 is decreased to keep the operating current Ir" intact. Accordingly, the buffering circuit 500 provides a high linearity between the input signal Sin" and the output signal Sout" such that the effect of finite and nonlinear output impedance of the first N-type MOSFET M10 can be eliminated.

It should be noted that the differential versions of the buffering circuit 500 also belong to the scope of the present invention. In the differential version of the buffering circuit 500, two control circuits 502 are adopted to track fully differential input signals inputted to the differential version of the buffering circuit 500. In addition, the differential version of the buffering circuit 500 performs with good total harmonic distortion (THD), especially in large signal swing.

Figure 6:
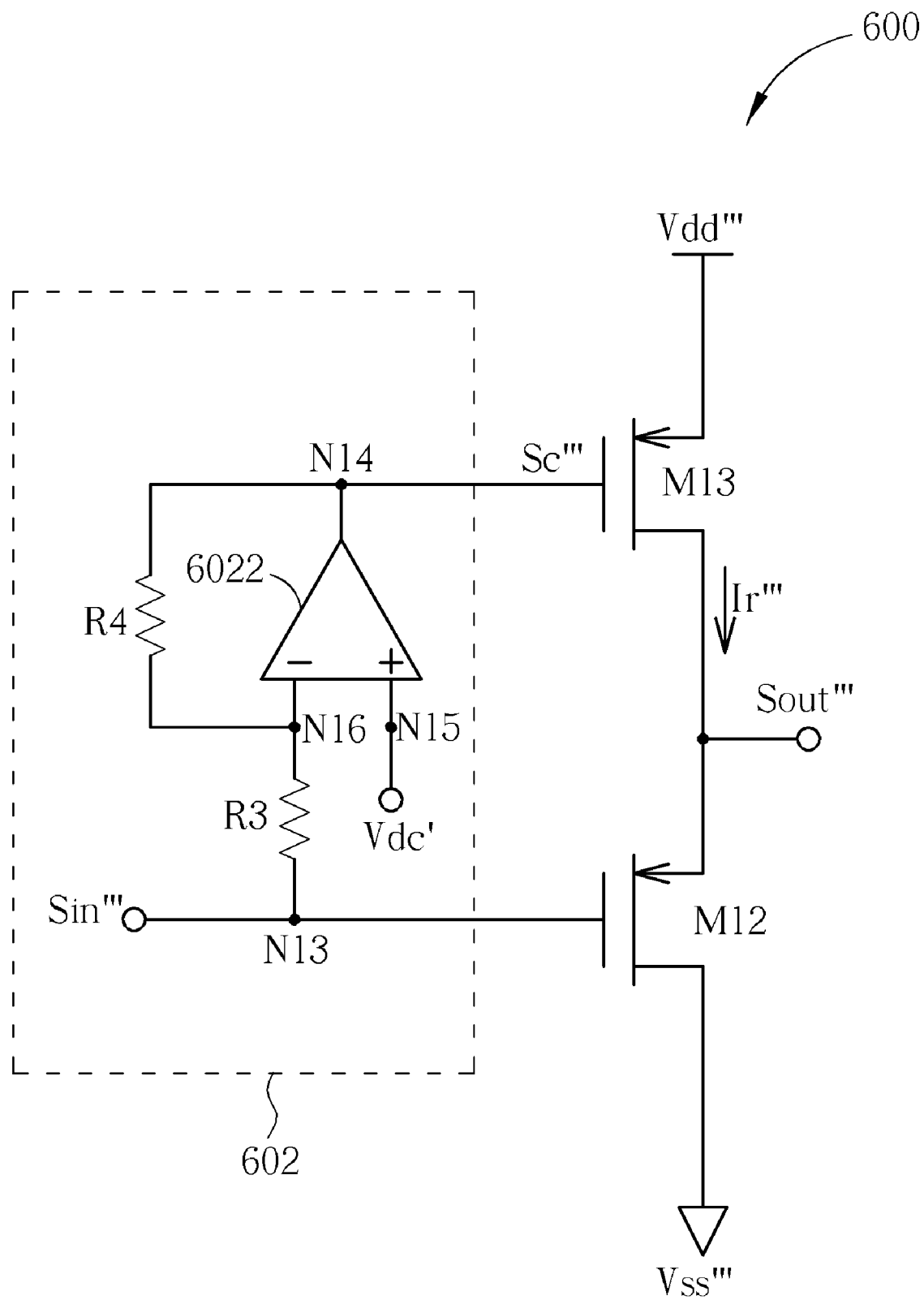
FIG. 6 is a diagram illustrating a buffering circuit according to a fifth embodiment of the present invention.

FIG. 6 is a diagram illustrating a buffering circuit 600 according to a fifth embodiment of the present invention. The buffering circuit 600 is the opposite version of the buffering circuit 500. The buffering circuit 600 operates between a first supply voltage Vdd'" and a second supply voltage Vss'", and comprises a first P-type metal oxide semiconductor field effect transistor (P-type MOSFET) M12, a second P-type MOSFET M13, and a control circuit 502. The first P-type MOSFET M12 comprises a gate terminal N13 coupled to an input signal Sin'" for buffering the input signal Sin'" to generate an output signal Sout'" under an operating current Ir'". The second P-type MOSFET M13 is cascoded with the first P-type MOSFET M12 for generating the operating current Ir'" for the first P-type MOSFET M12 according to a control signal Sc'" at a gate terminal N14 of the second P-type MOSFET M13. The control circuit 602 comprises a first terminal coupled to the gate terminal N13 of the first P-type MOSFET M12, a second terminal N15 coupled to a reference voltage Vdc', and a third terminal coupled to the gate terminal N14 of the second P-type MOSFET M13. The control circuit 602 adjusts the control signal Sc'" according to the input signal Sin'" and the reference voltage Vdc', wherein when a voltage level of the input signal Sin''' increases, the control circuit 602 is arranged to decrease a voltage level of the control signal Sc'''.

The control circuit 602 comprises a first resistive device R3, a second resistive device R4, and an operational amplifier 6022. The first resistive device R3 has a first terminal coupled to the gate terminal N13 of the first P-type MOSFET M12. The operational amplifier 6022 has a first input terminal (+) coupled to the reference voltage Vdc', a second input terminal (−) coupled to a second terminal N16 of the first resistive device R3, and an output terminal coupled to the gate terminal N14 of the second P-type MOSFET M13. The second resistive device R4 is coupled between the second input terminal (−) of the operational amplifier 6022 and the gate terminal N14 of the second N-type MOSFET M13.

Similar to the operation of the buffering circuit 500, the feedback mechanism comprised of the first resistive device R3, the second resistive device R4, and the operational amplifier 6022 keeps the operating current Ir''' intact to increase the linearity of the buffering circuit 600 such that the effect of finite and nonlinear output impedance of the first P-type MOSFET M12 can be eliminated. Furthermore, it should be noted that the differential versions of the buffering circuit 600 also belong to the scope of the present invention.

Briefly, the above-mentioned buffering circuits 200, 300, 400, 500, 600 utilize feedback mechanisms to keep the operating currents intact in order to increase the linearity between the input signals and the output signals.

Those skilled in the art will readily observe that numerous modifications and alterations of the device and method may be made while retaining the teachings of the invention.

What is claimed is:

1. A buffering circuit, which is operated between a first supply voltage and a second supply voltage, comprising:
    a first field effect transistor, comprising a gate terminal coupled to an input signal, for buffering the input signal to generate an output signal under an operating current;
    a second field effect transistor, cascoded with the first field effect transistor, for generating the operating current for the first field effect transistor according to a control signal at a gate terminal of the second field effect transistor; and
    a control circuit, comprising a first terminal coupled to the gate terminal of the first field effect transistor and a second terminal coupled to a reference source, the control circuit for adjusting the control signal according to the input signal and the reference source, wherein when a voltage level of the input signal varies, the control circuit is arranged to adjust a voltage level of the control signal such that the adjusted voltage level of the control signal varies inversely proportional to the varied voltage level of the input signal, the control circuit further comprises:
        a third field effect transistor, comprising a gate terminal coupled to the gate terminal of the first field effect transistor, and a drain terminal coupled to the reference source; and
        a fourth field effect transistor, comprising a drain terminal coupled to a source terminal of the third field effect transistor, a source terminal coupled to the second supply voltage, and a gate terminal coupled to the reference source and the gate terminal of the second field effect transistor.

2. The buffering circuit of claim 1, wherein when the voltage level of the input signal increases, the control circuit is arranged to decrease the voltage level of the control signal, when the voltage level of the input signal decreases, the control circuit is arranged to increase the voltage level of the control signal.

3. The buffering circuit of claim 1, wherein the first field effect transistor, the second field effect transistor, the third field effect transistor, and the fourth field effect transistor are N-type metal oxide semiconductor field effect transistors.

4. The buffering circuit of claim 1, wherein the first field effect transistor, the second field effect transistor, the third field effect transistor, and the fourth field effect transistor are P-type metal oxide semiconductor field effect transistors.

5. The buffering circuit of claim 1, further comprising:
    a fifth field effect transistor, comprising a gate terminal coupled to a drain terminal of the first field effect transistor, a drain terminal coupled to a source terminal of the first field effect transistor, and a source terminal coupled to a third supply voltage.

6. The buffering circuit of claim 5, wherein the first field effect transistor and the second field effect transistor are P-type metal oxide semiconductor field effect transistors, and the fifth field effect transistor is an N-type metal oxide semiconductor field effect transistor.

7. The buffering circuit of claim 5, wherein the first field effect transistor and the second field effect transistor are N-type metal oxide semiconductor field effect transistors, and the fifth field effect transistor is a P-type metal oxide semiconductor field effect transistor.

8. The buffering circuit of claim 1, wherein the control circuit further comprises:
    a level shifter, coupled between the drain terminal of the third field effect transistor and the gate terminal of the fourth field effect transistor, for adjusting a voltage drop between the drain terminal of the third field effect transistor and the gate terminal of the fourth field effect transistor according to the input signal.

9. The buffering circuit of claim 8, wherein the level shifter comprises a resistive device.

10. A buffering circuit, comprising:
    a first field effect transistor, comprising a gate terminal coupled to an input signal, for buffering the input signal to generate an output signal under an operating current;
    a second field effect transistor, cascoded with the first field effect transistor, for generating the operating current for the first field effect transistor according to a control signal at a gate terminal of the second field effect transistor;
    a control circuit, comprising a first terminal coupled to the gate terminal of the first field effect transistor and a second terminal coupled to a reference source, the control circuit for adjusting the control signal according to the input signal and the reference source, wherein when a voltage level of the input signal varies, the control circuit is arranged to adjust a voltage level of the control signal such that the adjusted voltage level of the control signal varies inversely proportional to the varied voltage level of the input signal; and
    a fifth field effect transistor, comprising a gate terminal coupled to a drain terminal of the first field effect transistor, a drain terminal coupled to a source terminal of the first field effect transistor, and a source terminal coupled to a supply voltage.

11. A buffering circuit, comprising:
    a first field effect transistor, comprising a gate terminal coupled to an input signal, for buffering the input signal to generate an output signal under an operating current;
    a second field effect transistor, cascoded with the first field effect transistor, for generating the operating current for the first field effect transistor according to a control signal at a gate terminal of the second field effect transistor; and a control circuit, comprising a first terminal coupled to the gate terminal of the first field effect transistor and a second terminal coupled to a reference source, the control circuit for adjusting the control signal according to the input signal and the reference source, wherein when a voltage level of the input signal varies, the control circuit is arranged to adjust a voltage level of the control signal such that the adjusted voltage level of the control signal varies inversely proportional to the varied voltage level of the input signal, the control circuit further comprises:

a first resistive device, having a first terminal coupled to the gate terminal of the first field effect transistor;

an operational amplifier, having a first input terminal coupled to a reference voltage, a second input terminal coupled to a second terminal of the first resistive device, and an output terminal coupled to the gate terminal of the second field effect transistor; and a second resistive device, coupled between the second input terminal of the operational amplifier and the gate terminal of the second field effect transistor.

12. A buffering circuit, comprising:

a first field effect transistor, comprising a gate terminal coupled to an input signal, for buffering the input signal to generate an output signal under an operating current;

a second field effect transistor, cascoded with the first field effect transistor, for generating the operating current for the first field effect transistor according to a control signal at a gate terminal of the second field effect transistor; and a control circuit, comprising a first terminal coupled to the gate terminal of the first field effect transistor and a second terminal coupled to a reference source, the control circuit for adjusting the control signal according to the input signal and the reference source, wherein the input signal is inputted between the first field effect transistor and the control circuit, and when a voltage level of the input signal varies, the control circuit is arranged to adjust a voltage level of the control signal such that the adjusted voltage level of the control signal varies inversely proportional to the varied voltage level of the input signal.

13. The buffering circuit of claim 12, wherein the buffering circuit operates between a first supply voltage and a second supply voltage, and the control circuit further comprises:

a third field effect transistor, comprising a gate terminal coupled to the gate terminal of the first field effect transistor, and a drain terminal coupled to the reference source; and a fourth field effect transistor, comprising a drain terminal coupled to a source terminal of the third field effect transistor, a source terminal coupled to the second supply voltage, and a gate terminal coupled to the reference source and the gate terminal of the second field effect transistor.

14. The buffering circuit of claim 13, wherein the control circuit further comprises:

a level shifter, coupled between the drain terminal of the third field effect transistor and the gate terminal of the fourth field effect transistor, for adjusting a voltage drop between the drain terminal of the third field effect transistor and the gate terminal of the fourth field effect transistor according to the input signal.

15. The buffering circuit of claim 12, further comprising:

a fifth field effect transistor, comprising a gate terminal coupled to a drain terminal of the first field effect transistor, a drain terminal coupled to a source terminal of the first field effect transistor, and a source terminal coupled to a first supply voltage.

16. A buffering circuit, comprising:

a first field effect transistor, comprising a gate terminal coupled to an input signal, for buffering the input signal to generate an output signal under an operating current;

a second field effect transistor, cascoded with the first field effect transistor, for generating the operating current for the first field effect transistor according to a control signal at a gate terminal of the second field effect transistor; and a control circuit, comprising a first terminal coupled to the gate terminal of the first field effect transistor and a second terminal coupled to a reference source, the control circuit for adjusting the control signal according to the input signal and the reference source to substantially maintain a current passing through the second field effect transistor at a constant level.

17. The buffering circuit of claim 16, wherein the buffering circuit operates between a first supply voltage and a second supply voltage, and the control circuit further comprises:

a third field effect transistor, comprising a gate terminal coupled to the gate terminal of the first field effect transistor, and a drain terminal coupled to the reference source; and a fourth field effect transistor, comprising a drain terminal coupled to a source terminal of the third field effect transistor, a source terminal coupled to the second supply voltage, and a gate terminal coupled to the reference source and the gate terminal of the second field effect transistor.

18. The buffering circuit of claim 17, wherein the control circuit further comprises:

a level shifter, coupled between the drain terminal of the third field effect transistor and the gate terminal of the fourth field effect transistor, for adjusting a voltage drop between the drain terminal of the third field effect transistor and the gate terminal of the fourth field effect transistor according to the input signal.

19. The buffering circuit of claim 16, further comprising:

a fifth field effect transistor, comprising a gate terminal coupled to a drain terminal of the first field effect transistor, a drain terminal coupled to a source terminal of the first field effect transistor, and a source terminal coupled to a first supply voltage.

20. The buffering circuit of claim 16, wherein the control circuit further comprises:

a first resistive device, having a first terminal coupled to the gate terminal of the first field effect transistor;

an operational amplifier, having a first input terminal coupled to a reference voltage, a second input terminal coupled to a second terminal of the first resistive device, and an output terminal coupled to the gate terminal of the second field effect transistor; and a second resistive device, coupled between the second input terminal of the operational amplifier and the gate terminal of the second field effect transistor.

* * * * *